United States Patent [19]
Tresp

[11] Patent Number: 5,442,543
[45] Date of Patent: Aug. 15, 1995

[54] NEURAL FILTER ARCHITECTURE FOR OVERCOMING NOISE INTERFERENCE IN A NON-LINEAR, ADAPTIVE MANNER

[75] Inventor: Volker Tresp, München, Germany
[73] Assignee: Siemens Aktiengesellschaft, Munich, Germany
[21] Appl. No.: 211,656
[22] PCT Filed: Aug. 6, 1993
[86] PCT No.: PCT/DE93/00697
  § 371 Date: Apr. 11, 1994
  § 102(e) Date: Apr. 11, 1994
[87] PCT Pub. No.: WO94/05080
  PCT Pub. Date: Mar. 3, 1994

[30] Foreign Application Priority Data
Aug. 11, 1992 [DE] Germany .......... 42 26 598.3
[51] Int. Cl.⁶ .......... G05B 13/04; G06F 15/18
[52] U.S. Cl. .......... 364/149; 364/151; 395/23
[58] Field of Search .......... 364/148, 149, 150, 151, 364/572; 395/21, 23, 24

[56] References Cited
U.S. PATENT DOCUMENTS

| | | | |
|---|---|---|---|
| 4,937,872 | 6/1990 | Hopfield et al. | 395/24 |
| 5,253,329 | 10/1993 | Villarreal et al. | 395/23 |
| 5,313,407 | 5/1994 | Tiernan et al. | 364/508 |

OTHER PUBLICATIONS

"A Nonlinear Digital Filter using Multi-Layered Neural Network" by Arakawa, et al., IEEE International Conference on Communications ICC '90 Including Supercomm Technical Sessions, Apr. 15–19, 1990, pp. 424–428.
"Adaptive Processing with Neural Network Controlled Resonator–Banks" by Sztipanovits, IEEE Transactions on Circuits and Systems, vol. 37, No. 11, Nov. 1990, pp. 1436–1440.
"Neural Information Processing Systems" by Lapedes, American Institute of Physics 1988, pp. 442–457.
"Modular Construction of Time–Delay Neural Networks for Speech Recognition" by Waibel, Neural Computation, vol. 1, 1989, pp. 39–46.

*Primary Examiner*—Paul P. Gordon
*Attorney, Agent, or Firm*—Hill, Steadman & Simpson

[57] ABSTRACT

The non-linear filter architecture according to the invention provides a neural network for modelling a non-linear transfer function, there being supplied to the neural network, on the input side, the filter input signals $f(n), \ldots, f(n-i), \ldots, f(n-M)$, a time index signal $i$ and the values $p(n), \ldots, p(n-i), \ldots, p(n-M)$ of the parameter vector $p$. The neural network uses these values to calculate, at each time $i$, output values which are summed for the $M+1$ times $i=0, \ldots, M$, as a result of which the filter output function $g(n)$ is formed. The invention can be used for implementing a method for overcoming noise signals in digital signal processing, by using a circuit arrangement or a software system. Specifically, the invention can be used in a method for suppressing cardio-interference in magneto-encephalography. The invention can furthermore be used for overcoming motor noise.

6 Claims, 2 Drawing Sheets

Zeit

NEURAL FILTER ARCHITECTURE FOR OVERCOMING NOISE INTERFERENCE IN A NON-LINEAR, ADAPTIVE MANNER

BACKGROUND OF THE INVENTION

1. Field of the Invention

The present invention relates generally to a filter architecture using a neural network, and to a method and an apparatus for implementing the architecture.

2. Description of the Related Art

Neural networks are already used in a wide range of applications of adaptive non-linear filters. In the case of most of these applications, the number of input variables of the network is small and the amount of noise on the training signal is relatively low. If these conditions do not prevail, it is frequently difficult to train a network, particularly if rapid adaptation is required.

The transfer characteristic of a general, discrete linear filter can be described by the formula $$g(n) = \sum_{i=0}^{M} f(n-i) \cdot k(i) + \sum_{i=0}^{M} g(n-i) \cdot r(i) \quad (1)$$

In this case, g(n) designates the output variable of the linear filter at time n, f(n−i) designates the input variable of the filter at time n−i, and the functions k and r designate the response functions of the discrete linear filter. A so-called FIR filter (filter with a finite pulse response) is provided for the case in which the function r disappears at all times i. The output function of the filter is in this case a linear superposition of instantaneous and preceding input signals and preceding output signals.

This filter structure can be generalized to form a non-linear filter architecture, which is given by the formula $$g(n) = N[f(n), \ldots, f(n-M); g(n-1), \ldots, g(n-K)] \quad (2)$$

In this case, the output function N depends in a non-linear manner on the input and output signals. The non-linear function N is in this case approximated by a neural network, which is the case for the filter architecture proposed by Lapedes and Farber (A. Lapedes, R. Farber, "How neural nets work." In Neural information processing systems, ed. D. Z. Anderson, pages 442–456, New York, American Institute of Physics, 1988) Waibel (A. Waibel, "Modular construction of time-delay neural networks for speech recognition", Neural Computation, Vol. 1, pages 39–46, 1989) has described a neural network in the case of which only the input signals of preceding times are supplied to the input variables.

SUMMARY OF THE INVENTION

In the context of this patent application, it is intended to consider systems in the case of which the properties of the input functions influence the properties of the output function of the system over long periods. Using recursive networks, such systems can be modelled with long-lasting response functions. As an alternative to this, the length of the response function M could be selected to be sufficiently large. This necessitates a large number of input variables for the neural network used, and the training of the network is in consequence inefficient.

The present invention is therefore based on the object of specifying a non-linear filter architecture using which long-lasting filter response functions can be implemented, which filter architecture is at the same time insensitive to noise in the training signal and whose transfer characteristics can be rapidly matched to a specific object (rapid adaptation).

This and other objects and advantages are achieved according to the invention using a non-linear filter architecture having an input signal f(n−i) to the non-linear filter, which input signal is associated with time n−i and is possibly multi-dimensional, a time signal for the time i and a parameter vector p(n−i) associated with time n−i are linked, at time i, to the input nodes of a neural network;

b) the output signal g(n) of the non-linear filter at time n results from summation of M+1 output signals, which are associated with the times n, ..., n−M, of the neural network, in accordance with the formula $$g(n) = \sum_{i=0}^{M} N[f(n-i), i, p(n-i)]$$

where N designates the output function of the neural network. An adaptation method for a non-linear filter architecture is provided, wherein each weighting w of the neural network is varied in such a manner that a predetermined error E, which represents the value of the deviation, determined over a predetermined time interval, of the output signals g(n) of the filter from the required output signals gm(n), is minimized by varying the weightings of the neural network. A circuit arrangement for implementing a non-linear filter architecture is also provided, wherein a) a memory is provided for storing the instantaneous filter input signal f(n), the instantaneous values p(n) of the parameter vector, the last M filter input signals f(n−1), ..., f(n−M) and parameter vectors p(n−1), ..., p(n−M);

b) means are provided which, for M+1 successive times n−M, ..., n, supply the memory contents associated with these times to the input nodes to the neural network;

c) means are provided for summation of the output values of the neural network over the times n−M, ..., n.

The filter architecture according to the invention is defined most simply by the mathematical relationship $$g(n) = \sum_{i=0}^{M} N[f(n-i), i, p(n-i)] \quad (3)$$

The non-linear transfer function N is in this case implemented by a neural network to whose input nodes the input signal f(n−i) to the non-linear filter, which input signal is associated with time n−i and is possibly multi-dimensional, a time signal for the time i and a parameter vector p(n−i) associated with time n−i are linked, at time i. The output signal g(n) of the non-linear filter at time n then results from summation of M+1 output signals, which are associated with the times n, ... n−M, of the neural network, in accordance with the formula (3).

In a similar manner to that in the case of an FIR filter, the output signal of the filter is the sum of responses to chronologically historical input signals to the system. The difference to an FIR filter is that the responses depend in a non-linear manner on the input signals f(n−i) and the time i which has passed since the occurrence of the input signal and the parameter vector p. The relationship to the known FIR filter in this case becomes even clearer if the following variant of the non-linear filter architecture according to the invention is considered: specifically, if it is assumed that the output signal g(n) depends in a linear manner on the input signals f(n−i), the following more specific formula:

$$g(n) = \sum_{i=0}^{M} f(n-i) \cdot N[i, p(n-i)] \quad (4)$$

is obtained, in the case of which the neural network processes only the time index i and the parameter vector p as input signals, and the output values of the neural network are multiplied by the input signals f(n−i) and are subsequently summed over the times i. If it is furthermore assumed that the filter is independent of the parameter vector p, the even more specific filter architecture in accordance with the formula $$g(n) = \sum_{i=0}^{M} f(n-i) \cdot N[i] \quad (5)$$

is obtained, which corresponds to an FIR filter whose response function (filter coefficients) is given by the output values of a neural network whose only input variable is the time index.

The specific filter architectures of the formulae (4) and (5) are all special cases of the generally non-linear filter architecture which is given by the formula (3).

It is a particular advantage of the filter architecture defined by the formula (5) that, in the case of this filter architecture, the training times can be considerably reduced compared with those for conventional FIR filters, in the case of very large values of M. Specifically, if the neural network has less than M parameters, it can provide a more efficient description of the filter function, as a result of which adaptation is possible with far less training complexity. Also linked to this situation is the fact that the neural network results in an implicit limitation of the complexity of the filter response. The complexity of an FIR filter is in general reduced in that the value of M is reduced. This can be done either by reduction of the width of the time window, which is undesirable, however, since the filter is actually intended to have a long-lasting response function, or by reducing the sampling frequency, as a result of which, however, the bandwidth of the filter is reduced to an undesirable extent. In contrast, the complexity of a neural network is defined by the number of neurons and the weightings in the network. A neural network has the capability to distribute resources in an adaptive manner, as the data which are supplied to this network require. Thus, to a certain extent, the network is taught, during the training phase, an optimum distribution of the resources (neurons and weightings) of the network for optimum approximation of the transfer function. This avoids resources of the network being wasted in an unnecessary manner where a good approximation is possible even using a small number of parameters and resources.

In a somewhat more general variant of the non-linear filter according to the invention which is represented by the formula (4), the parameter vector represents an additional input to the network. Using this parameter vector p, the response of the filter can be influenced by external parameters, which normally change very slowly. However, for a neural network, a new parameter simply represents an additional input. If it were intended to take into account such parameters using conventional FIR filter architectures, the filter would have to be retrained for each value set of this parameter vector, as a result of which the number of filter coefficients required, and hence the time required for training, would be increased enormously.

Finally, there are a whole series of applications in the case of which linear filter architectures are not suitable for modelling the system properties. For this reason, the filter architecture according to the invention is, in its most general form, a non-linear filter architecture according to the formula (3), which clearly includes, as special cases, the more specific architectures which are given by the formulae (4) and (5).

The weightings of the neural network are adapted, in a preferred embodiment of the invention, by each weighting w of the neural network being varied in such a manner that a predetermined error E, which represents the value of the deviation, determined over a predetermined time interval, of the output signal g(n) of the filter from the required output signals $g_m(n)$, being minimized by varying the weightings of the neural network.

The non-linear filter architecture according to the invention can be implemented, for example, using a circuit arrangement having the features of a) a memory is provided for storing the instantaneous filter input signal f(n), the instantaneous values p(n) of the parameter vector, the last M filter input signals f(n−1), ..., f(n−M) and parameter vectors p(n−1), ..., p(n−M);

b) means are provided which, for M+1 successive times n−M, ..., n, supply the memory contents associated with these times to the input nodes to the neural network;

c) means are provided for summation of the output values of the neural network over the times n−M, ..., n. In the case of this circuit arrangement, a memory is provided for storing the instantaneous filter input signal, the instantaneous values of the parameter vector, and the last M filter input signals and parameter vectors. Furthermore, means are provided which, for M+1 successive times, supply the memory contents associated with these times to the input nodes to the neural network. Furthermore, means are provided for summation of the output values of the neural network over these times.

The invention can be used in order to implement a method for overcoming noise signals in digital signal processing, in that a circuit arrangement or a software system is used having a non-linear filter architecture with the following features:

a) the input signal f(n−i) to the non-linear filter, which input signal is associated with time n−i and is possibly multi-dimensional, a time signal for the time i and a parameter vector p(n−i) associated with time n−i are linked, at time i, to the input nodes of a neural network;

b) the output signal g(n) of the non-linear filter at time n results from summation of M+1 output signals, which are associated with the times n, ..., n−M, of the neural network, in accordance with the formula $$g(n) = \sum_{i=0}^{M} N[f(n-i), i, p(n-i)]$$

where N[] designates the output function of the neural network. Further, an adaptation method for a non-linear filter architecture as just described may be used, in the case of which each weighting w of the neural network is varied in such a manner that a predetermined error E, which represents the value of the deviation, determined over a predetermined time interval, of the output signals g(n) of the filter from the required output signals gm(n), is minimized by varying the weightings of the neural network. A circuit arrangement for implementing a non-linear filter architecture as set forth has the following features:

a) a memory is provided for storing the instantaneous filter input signal f(n), the instantaneous values p(n) of the parameter vector, the last M filter input signals f(n−1), ..., f(n−M) and parameter vectors p(n−1), ..., p(n−M);

b) means are provided which, for M+1 successive times n−M, ..., n, supply the memory contents associated with these times to the input nodes to the neural network;

c) means are provided for summation of the output values of the neural network over the times n−M, ..., n. Specifically, the invention can be used in a method for suppressing cardio-interference in magneto-encephalography. The invention can furthermore be used for overcoming motor noise.

BRIEF DESCRIPTION OF THE DRAWINGS

FIG. 2a shows the filter architecture in accordance with formula (3) and FIG. 2b shows the filter architecture in accordance with formula (5).

DETAILED DESCRIPTION OF THE PREFERRED EMBODIMENTS

The invention is described in more detail in the following text with reference to a preferred exemplary embodiment and using the figures.

Figure 2A:
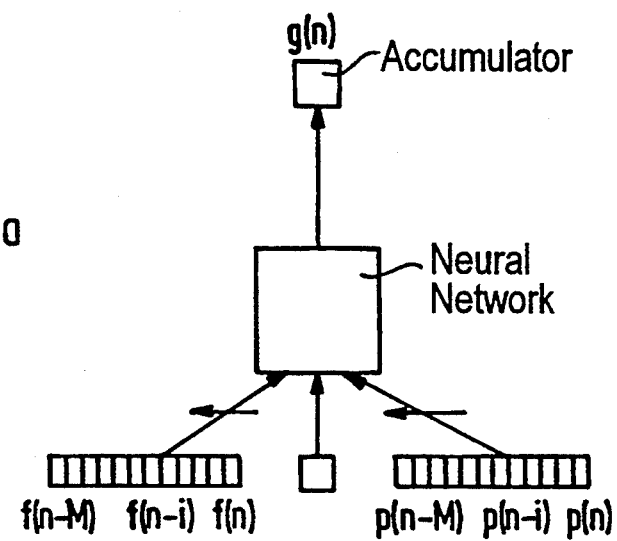
FIGS. 2a and 2b shows a schematic illustration of the non-linear filter architecture according to the invention. In this case.

The non-linear filter architecture according to the invention provides a neural network for modelling a non-linear transfer function, there being supplied on the input side to the neural network, as illustrated schematically in FIG. 2a, the filter input signals f(n), ..., f(n−i), ..., f(n−M), a time index signal i and the values p(n), ..., p(n−i), ..., p(n−M) of the parameter vector p.. The neural network uses these values to calculate, at each time i, output values which are summed for the M+1 times i=0, ..., M, as a result of which the filter output function g (n) is formed in accordance with the formula $$g(n) = \sum_{i=0}^{M} N[f(n - i), i, p(n - i)] \quad (3)$$

By analogy with the FIR filter, in this case the output function of the filter is the sum of responses to chronologically historical input data to the system. In contrast to an FIR filter, the filter architecture according to the invention in general depends in a non-linear manner on the input signals f, on the time i and on the parameter vector p. If it is assumed that the filter depends in a linear manner on the input signals f, the filter architecture according to the invention is specialized in accordance with the formula $$g(n) = \sum_{i=0}^{M} f(n - i) \cdot N[i, p(n - i)] \quad (4)$$

to a linear filter whose filter coefficients are calculated by the neural network from the time index i and the values of the parameter vector. For the case in which entry of a parameter vector is dispensed with, the filter architecture according to the invention is further specialized in accordance with the formula $$g(n) = \sum_{i=0}^{M} f(n - i) \cdot N[i] \quad (5)$$

to a linear FIR filter architecture whose transfer function is calculated by the neural network from the time signal i. In equation (5), there is only one input signal for the network, which signal is the time i which has passed since the occurrence of the input signal f(n−i). This special architecture describes an FIR filter having a filter response function which is modelled by a neural network. This has advantages which have intrinsically already been defined. If M is very large (which is the case in the following application, where M=approximately 400), a large number of training data items are required in order to specify all the coefficients of a conventional FIR filter.

If, in contrast, the neural network has less than M parameters, a more efficient description of the filter function can be obtained, as a result of which a smaller number of training data items are required to learn an approximated filter response.

Also linked to this is the fact that the neural network represents an implicit necessary condition on the complexity of the filter response. The complexity of an FIR filter is normally reduced by reducing the value M. This can be done in two ways: on the one hand by reducing the time window for the response function. This is undesirable in many cases since the objective is actually to model a filter having a long-lasting response function. The other possibility is to reduce the sampling frequency, as a result of which, however, the bandwidth of the filter is reduced. In contrast, the complexity of the neural network is defined by the number of neurons and the weightings in this network. A network has the capability to distribute resources such that the complexity of the function to be modelled results from the data. In consequence, few resources are used where the data indicate a good approximation. An explanation is given further below, using an application, on how this is done in the case of a specific exemplary embodiment. Thus, in this example, the response function has a narrow peak, so that few resources of the neural network are used in the region of the otherwise flat behavior of the response function.

In the case of the filter architecture which is given by equation (4), a parameter vector p is provided as an additional input signal for the neural network. Using this parameter vector p, the response function can be influenced by means of external parameters, which typically change slowly. In medical applications, one of these parameters can be the respiration, and in other applications a time delay, a temperature or humidity. In these cases, the efficiency of the filter architecture according to the invention is particularly important. For a neural network, a new parameter simply means an additional input signal. If, on the other hand, a new FIR filter had to be trained for every possible p, the number of coeffients and hence the number of training data items required would increase very greatly. To a certain extent, this corresponds to the representation of a regression function either by a table (look-up table, FIR filter) or by a neural network (the solution according to the invention).

A monitored learning method is advantageously used for training the neural network, that is to say for adaptation of the filter architecture according to the invention, in the case of which learning method a predetermined energy function, preferably in accordance with the formula $$E = \frac{1}{2} \sum_n (g_m(n) - g(n))^2 \qquad (6)$$

is minimized. In this case, $g_m(n)$ means the desired output function of the system at time n, and g(n) the actual, instantaneous output function of the filter. The energy E can be minimized, for example using a steepest-descent gradient method, each weighting w of the network being varied by a weighting increment in accordance with the relationship $$\Delta w \propto \sum_n (g_m(n) - g(n)) \cdot \frac{dg(n)}{dw} \qquad (7)$$

In this case, in accordance with formula (3), the gradient g(n) is given by $$\frac{dg(n)}{dw} = \sum_{i=0}^{M} \frac{\partial N[f(n-i), i, p(n-i)]}{\partial w} \qquad (8)$$

Other, for example, non-deterministic, methods can also be used as an alternative to the steepest-descent gradient method for minimizing the energy function. This is particularly advantageous if it is possible for the energy function to have a multiplicity of local minima.

A circuitry implementation of the non-linear filter architecture according to the invention is possible, for example, using a circuit arrangement in the case of which a memory is provided in which the last M values and the instantaneous value of the input signal f are stored, as well as the parameter vector p. In order to calculate a new value of the output function g(n), the values f(n−i), p(n−i) and i for the times i:0, ... M are applied chronologically sequentially to the inputs of the neural network, and the output data of this neural network are summed using an accumulator. In order to calculate the output value for the respectively subsequent time, the memory contents are displaced in the manner of a shift register and a new value for the input signal and parameter vector are read into the memory.

Figure 2B:
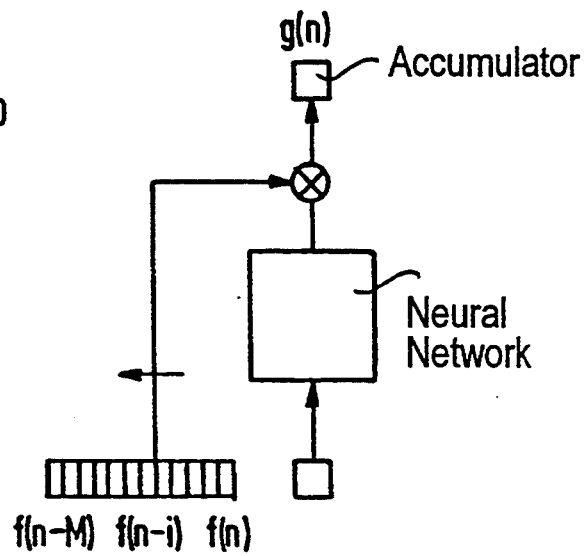

Although it is advantageous to use a neural network for the training phase, for the application of the already adapted filter it is frequently advantageous to replace the neural network by a suitable table (look-up table) which can be implemented in circuitry terms by a suitable memory. This variant is particularly advantageous in the case of the filter architecture according to formula (5). This special architecture of the filter according to the invention is illustrated schematically in FIG. 2b. In this case, the value f(n−i) are not applied to the neural network but are multiplied by the output values of the neural network.

Possible applications of the filter architecture according to the invention are illustrated in the following text. In magneto-encephalography (MEG), an arrangement, in the form of a matrix, of highly sensitive superconductive SQUID detectors is used in order to record (scan), in a non-invasive manner, the extremely weak magnetic fields which are produced by the brain. These measurements are used to localize power centres of neural activity, such as epilepsy centres for example.

Figure 1:
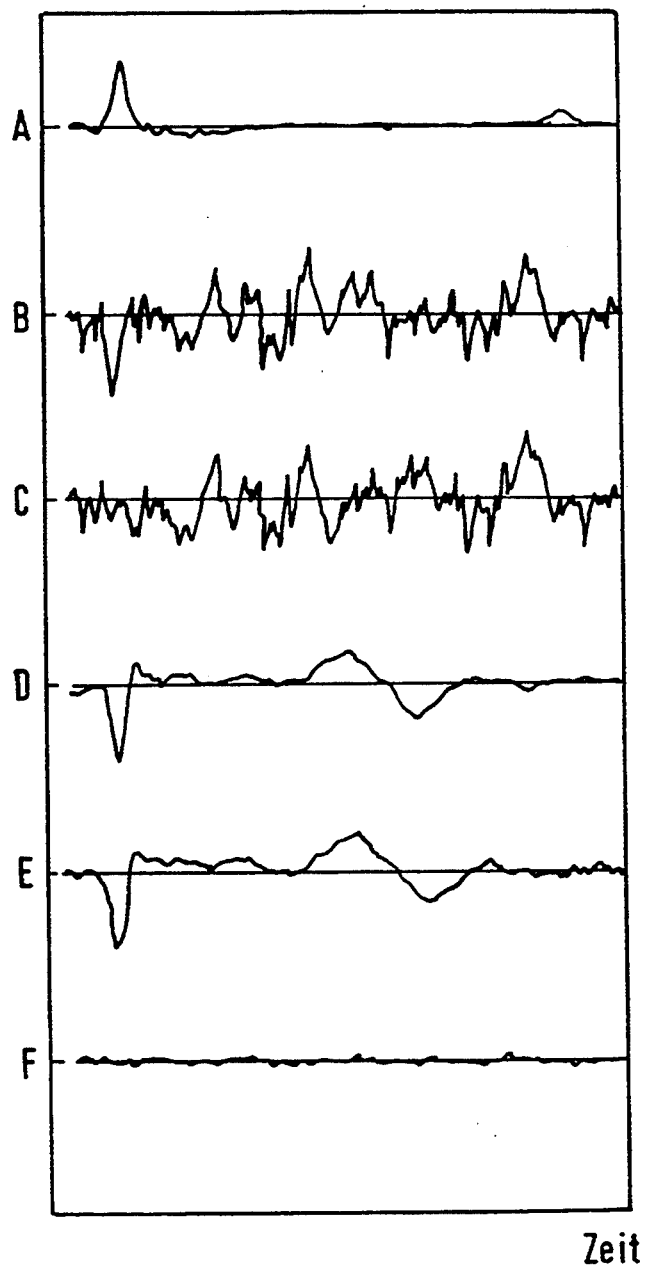
FIG. 1 shows the signal wave forms of various signals in conjunction with the non-linear filter architecture according to the invention.

FIG. 1 shows various signal wave forms in the context of magneto-encephalography. Curve A shows a typical electrocardiogram. Curve B shows the actual MEG signal on which so-called cardio-interference, which originates from the ECG, is superimposed. In particular, the negative swing of the curve during the QRS complex of the ECG is visible. Curve C shows the corrected MEG signals. Curve D shows the output function of the neural network. Curve E shows the triggered summation of the MEG signal, the cardio-interference being visible in an isolated manner. Curve F shows the triggered summation of the corrected MEG signal, in which summation there is no cardio-interference.

Since the magnetic field of the earth is eight orders of magnitude stronger than the magnetic field of the brain, all the measurements must be carried out in a magnetically screened room. The magnetic field which is produced by the heart muscle is a source of noise which cannot be screened out in a simple manner but which has a severe adverse influence on the measurements.

Overcoming cardio-interference is a difficult task since neither the MEG nor the cardio-interference can be measured independently of one another and since mathematical models of those physical and physiological processes which produce cardio-interference are not available. However, since it is possible to record an independent measurement via the source of the interference signal in the form of an electrocardiogram (EGC), it is possible to train a neural network such that it represents a model of this process. During the training phase, the ECG signals are the input data to the neural network, and the desired output data are the measured MEG signal. In the in-use phase, the output data of the neural network describe an estimate of the cardio-interference, which can then be subtracted from the measured MEG signal. Widrow (B. Widrow, S. D. Stearns, "Adaptive signal processing", Prentice Hall, Englewood Cliffs, N.J., 1985) has already shown that the necessary conditions for the capability to train a neural network which can model cardio-interference are as follows:

The MEG signal and the interference signal are uncorrelated.

The reference signal and the interference are correlated.

The measured signal is a linear superimposition of the interference and the MEG signal.

Experiments have shown that attempts to train a linear filter such that it is able to predict the interference from measurements of the ECG fail. This is mainly because of the high filter order required and the severe non-linearities.

In use of the filter architecture according to the invention, a QRS detector was used first in order to extract a time-delayed estimate of the heart trigger from the electrocardiogram. A further input signal was the amplitude of the QRS complex for the last heartbeat. It was possible to use respiration as a further relevant input variable, since the heart is in general moved by breathing.

Our experiments used a neural network having radial base functions with, typically, twenty hidden nodes (hidden units). FIG. 1c shows the MEG signal after overcoming the interference. In order to test the method according to the invention, the MEG signal was determined using the heartbeat period as the trigger. If the cardio-interference were not completely overcome, in this case it would be added and should be visible after a specific number of averaging operations. FIG. 1f shows that, after overcoming the interference, the averaged signal is essentially composed of random noise. In addition, simulations have confirmed that the cardio-interference is successfully overcome.

Although other modifications and changes may be suggested by those skilled in the art, it is the intention of the inventors to embody within the patent warranted hereon all changes and modifications as reasonably and properly come within the scope of their contribution to the art.

I claim:

1. A non-linear filter architecture, comprising:
   a) a memory means for storing values for input to a neural network;
   b) supply means connected to said memory means for successively supplying said values from said memory means to said neural network;
   c) a neural network having inputs connected said supply means to receive an input signal $f(n-i)$ associated with time $n-i$, a time signal for time i and a parameter vector $p(n-i)$ associated with time $n-i$ are linked, at time i;
   d) an accumulator means connected to said neural network for summing signals from said neural network;
   e) the neural network being constructed such that an output signal $g(n)$ from said accumulator means at time n results from summation of M+1 output signals, which are associated with times $n, \ldots, n-M$, in accordance with a formula $$g(n) = \sum_{i=0}^{M} N[f(n-i), i, p(n-i)]$$

where $N[f(n-i), i, p(n-i)]$ designates an output function of the neural network.

2. An adaptation method for a non-linear filter architecture, comprising the steps of:
   a) inputting an input signal $f(n-i)$ to a memory of the non-linear filter, which input signal is associated with time $n-i$, a time signal for a time i and a parameter vector $p(n-i)$ associated with time $n-i$ are linked, at time i, via said memory to input nodes of a neural network;
   b) summing in an accumulator connected to an output of the neural network results M+1 output signals, which are associated with the times $n, \ldots, n-M$, of the neural network, in accordance with a formula $$g(n) = \sum_{i=0}^{M} N[f(n-i), i, p(n-i)]$$

where $N[f(n-i), i, p(n-i)]$ designates an output function of the neural network to obtain an output signal $g(n)$ of the non-linear filter at time n;

varying each weighting w of the neural network in such a manner that a predetermined error E, which represents a value of deviation, determined over a predetermined time interval, of the output signals $g(n)$ of the filter from required output signals $g_m(n)$, is minimized by varying the weightings of the neural network.

3. A circuit arrangement for implementing a non-linear filter architecture, having:
   a) a neural network having inputs connected to receive an input signal $f(n-i)$ associated with time $n-i$, a time signal for time i and a parameter vector $p(n-i)$ associated with time $n-i$ are linked, at time i;
   b) the neural network being constructed such that an output signal $g(n)$ at time n results from summation of M+1 output signals, which are associated with times $n, \ldots, n-M$, in accordance with a formula $$g(n) = \sum_{i=0}^{M} N[f(n-i), i, p(n-i)]$$

where $N[f(n-i), i, p(n-i)]$ designates an output function of the neural network, comprising:
   a) a memory having an input for storing an instantaneous filter input signal $f(n)$, instantaneous values $p(n)$ of the parameter vector, last M filter input signals $f(n-1), \ldots, f(n-M)$ and parameter vectors $p(n-1), \ldots, p(n-M)$;
   b) supply means connected to said memory for, over M+1 successive times $n-M, \ldots, n$, supplying memory contents associated with these times to input nodes to the neural network;
   c) summing means connected to an output of the neural network are provided for summation of output values of the neural network over the times $n-M, \ldots, n$.

4. A method for overcoming noise signals in digital signal processing, comprising the steps of:
   a) inputting an input signal $f(n-i)$ to a memory for sequential application via a supply means to the non-linear filter, which input signal is associated with time $n-i$, a time signal for a time i and a parameter vector $p(n-i)$ associated with time $n-i$ are linked, at time i, to input nodes of a neural network;
   b) summing in an accumulator means connected to an output of the non-linear filter results M+1 output signals, which are associated with the times $n, \ldots, n-M$, of the neural network, in accordance with a formula $$g(n) = \sum_{i=0}^{M} N[f(n-i), i, p(n-i)]$$

where $N[f(n-i), i, p(n-i)]$ designates an output function of the neural network to obtain an output signal $g(n)$ of the non-linear filter at time n;

varying each weighting w of the neural network in such a manner that a predetermined error E, which represents a value of deviation, determined over a predetermined time interval, of the output signals $g(n)$ of the filter from required output signals $g_m(n)$, is minimized by varying the weightings of the neural network.

5. Use of a method as claimed in claim 4, for suppressing cardio-interference in magneto-encephalography.

6. Use of a method as claimed in claim 4, for overcoming motor noise.

* * * * *